US012028045B2

(12) United States Patent
Lee et al.

(10) Patent No.: US 12,028,045 B2
(45) Date of Patent: Jul. 2, 2024

(54) BULK ACOUSTIC RESONATOR FILTER

(71) Applicant: SAMSUNG ELECTRO-MECHANICS CO., LTD., Suwon-si (KR)

(72) Inventors: Tae Kyung Lee, Suwon-si (KR); Chan Hee Park, Suwon-si (KR); Jae Goon Aum, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 505 days.

(21) Appl. No.: 17/315,577

(22) Filed: May 10, 2021

(65) Prior Publication Data
US 2022/0209744 A1  Jun. 30, 2022

(30) Foreign Application Priority Data

Dec. 24, 2020 (KR) .................. 10-2020-0183642

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02015* (2013.01); *H03H 9/02157* (2013.01); *H03H 9/131* (2013.01); *H03H 9/54* (2013.01)

(58) Field of Classification Search
CPC ............... H03H 9/205; H03H 9/02015; H03H 9/02157; H03H 9/131; H03H 9/54;
(Continued)

(56) References Cited

U.S. PATENT DOCUMENTS 9,520,855 B2   12/2016  Feng et al.
2010/0110940 A1  5/2010  Hara et al.
(Continued)

FOREIGN PATENT DOCUMENTS

JP  5072047 B2  11/2012
JP  2014-68123 A  4/2014
(Continued)

OTHER PUBLICATIONS

Korean Office Action issued on Feb. 16, 2023, in counterpart Korean Patent Application No. 10-2020-0183642 (7 pages in English, 5 pages in Korean).
(Continued)

*Primary Examiner* — Rakesh B Patel
*Assistant Examiner* — Jorge L Salazar, Jr.
(74) *Attorney, Agent, or Firm* — NSIP Law

(57) ABSTRACT

A bulk acoustic resonator filter includes: a series bulk acoustic resonator electrically connected, in series, between first and second ports through which a radio frequency (RF) signal passes; a second shunt bulk acoustic resonator, electrically shunt connected between the series bulk acoustic resonator and a ground and having a resonance frequency lower than that of the series bulk acoustic resonator; and a first shunt bulk acoustic resonator electrically connected to the second shunt bulk acoustic resonator in series and having a resonance frequency higher than that of the second shunt bulk acoustic resonator. One or both of the series bulk acoustic resonator and the first shunt bulk acoustic resonator includes a first electrode disposed above a substrate; a piezoelectric layer disposed on the first electrode; a second electrode disposed on the piezoelectric layer; and a trench formed in an upper surface or above the second electrode and recessed downwardly.

18 Claims, 15 Drawing Sheets

(51) Int. Cl.
*H03H 9/13* (2006.01)
*H03H 9/54* (2006.01)

(58) Field of Classification Search
CPC .... H03H 9/02118; H03H 9/173; H03H 9/175; H03H 9/568; H03H 9/605; H03H 9/542; H03H 9/02007; H03H 9/02574; H03H 9/172
USPC ........................................ 333/186, 187, 188
See application file for complete search history.

(56) References Cited

U.S. PATENT DOCUMENTS

| | | |
|---|---|---|
| 2017/0338399 A1 | 11/2017 | Kim et al. |
| 2020/0119716 A1 | 4/2020 | Kim et al. |
| 2020/0343875 A1 | 10/2020 | Shealy |
| 2021/0075391 A1* | 3/2021 | Matsuo .............. H03H 9/02118 |

FOREIGN PATENT DOCUMENTS

| | | |
|---|---|---|
| KR | 10-2017-0130228 A | 11/2017 |
| KR | 10-2020-0041571 A | 4/2020 |

OTHER PUBLICATIONS

Taiwanese Office Action issued on Sep. 5, 2022, in counterpart Taiwanese Patent Application No. 110118053 (7 Pages in English, 8 Pages in Mandarin).

* cited by examiner

BULK ACOUSTIC RESONATOR FILTER

CROSS-REFERENCE TO RELATED APPLICATION(S)

This application claims the benefit under 35 USC 119(a) of Korean Patent Application No. 10-2020-0183642 filed on Dec. 24, 2020 in the Korean Intellectual Property Office, the entire disclosure of which is incorporated herein by reference for all purposes.

BACKGROUND

1. Field

The following description relates to a bulk acoustic resonator filter.

2. Description of Background

With the rapid development of mobile communication devices, chemical and biological testing devices, and the like, demand for small and lightweight filters, oscillators, resonance elements, acoustic resonance mass sensors, and the like, used in such devices, is increasing.

A bulk acoustic resonator such as a bulk acoustic wave (BAW) filter can be configured to implement such a small and lightweight filter, an oscillator, a resonance element, an acoustic resonance mass sensor, or the like. Since such a bulk acoustic resonator is significantly small and has good performance, compared to dielectric filters, metal cavity filters, wave guides, or the like, it may be widely used in communication modules of modern mobile devices that require good performance (e.g., a wide pass bandwidth).

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator filter includes: a series bulk acoustic resonator electrically connected, in series, between a first port and a second port through which a radio frequency (RF) signal passes; a second shunt bulk acoustic resonator, electrically shunt connected between the series bulk acoustic resonator and a ground and having a resonance frequency lower than a resonance frequency of the series bulk acoustic resonator; and a first shunt bulk acoustic resonator electrically connected to the second shunt bulk acoustic resonator in series and having a resonance frequency higher than a resonance frequency of the second shunt bulk acoustic resonator, wherein one or both of the series bulk acoustic resonator and the first shunt bulk acoustic resonator include a first electrode disposed above a substrate; a piezoelectric layer disposed on an upper surface of the first electrode; a second electrode disposed on an upper surface of the piezoelectric layer; and a trench disposed in an upper surface of the second electrode or above the second electrode and recessed downwardly.

The first shunt bulk acoustic resonator may include the first electrode, the piezoelectric layer, the second electrode, and the trench.

The resonance frequency of the first shunt bulk acoustic resonator may be equal to or higher than the resonance frequency of the series bulk acoustic resonator.

The trench may be disposed in the first shunt bulk acoustic resonator and the series bulk acoustic resonator, respectively.

A width of the trench may be 0.6 μm or more and 1.8 μm or less.

A depth of the trench may exceed 0 nm and may be 100 nm or less.

A bandwidth in a pass band between the first port and the second port may be 200 MHz or more.

When a frequency of an attenuation pole corresponding to a lowest frequency in a pass band between the first port and the second port is F and a width of the trench is W, {W*F} may be {0.6*3.485 (μm*GHz)} or more and {1.8*3.485 (μm*GHz)} or less.

When an area of overlap of the first electrode, the piezoelectric layer, and the second electrode is A and a width of the trench is W, {W/A} may be {0.6/4900 (μm/(μm)$^2$)} or more and {0.6/4900 (μm/(μm)$^2$)} or less.

The trench may be recessed toward the piezoelectric layer in the upper surface of the second electrode.

The second electrode may include a frame protruding upwardly on the upper surface of the second electrode, and a width of the trench may be less than a width of the frame.

The second shunt bulk acoustic resonator may be included in a plurality of second shunt bulk acoustic resonators each respectively disposed in a plurality of shunt connection paths between the series bulk acoustic resonator and the ground, the first shunt bulk acoustic resonator may be disposed in a portion of the plurality of shunt connection paths, and a shunt connection path among the plurality of shunt connection paths, in which the first shunt bulk acoustic resonator is disposed, may be disposed between a plurality of shunt connection paths among the plurality of shunt connection paths, in which the first shunt bulk acoustic resonator is not disposed.

The second shunt bulk acoustic resonator may be included in a plurality of second shunt bulk acoustic resonators each respectively disposed in a plurality of shunt connection paths between the series bulk acoustic resonator and the ground, the first shunt bulk acoustic resonator may be included in a plurality of first shunt bulk acoustic resonators each electrically connected to a corresponding second shunt bulk acoustic resonator among the plurality of second shunt bulk acoustic resonators in series, and a number of the plurality of second shunt bulk acoustic resonators may be greater than a number of the plurality of first shunt bulk acoustic resonators.

An inductance of at least one shunt connection path among the plurality of shunt connection paths, in which one of the plurality of first shunt bulk acoustic resonators is disposed, may be greater than an inductance of each remaining shunt connection path among the plurality of shunt connection paths.

The first shunt bulk acoustic resonator may include the trench, the second shunt bulk acoustic resonator may include a trench, and a width of the trench of the second shunt bulk acoustic resonator may be different than a width of the trench of the first shunt bulk acoustic resonator.

The second shunt bulk acoustic resonator may not include a trench.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

Figure 1A:
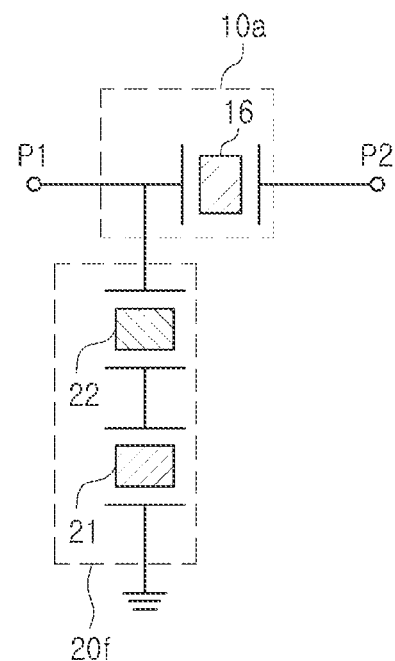
FIGS. 1A, 1B, 1C, 1D, 1E, 1F, 1G, and 1H are views illustrating a bulk acoustic resonator filter according to various examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

FIG. 1A is a view illustrating a bulk acoustic resonator filter according to an example.

Referring to FIG. 1A, a bulk acoustic resonator filter 50a may include a series portion 10a and a first shunt portion 20f, and may pass or block a radio frequency (RF) signal between a first port P1 and a second port P2 according to a frequency of the RF signal.

Referring to FIG. 1A, the bulk acoustic resonator filter 50a may include at least one series bulk acoustic resonator 16, at least one first shunt bulk acoustic resonator 21, and at least one second shunt bulk acoustic resonator 22, and may pass or block a radio frequency (RF) signal between the first port P1 and the second port P2 according to the frequency of the RF signal.

An electrical node between the at least one series bulk acoustic resonator 16, the at least one first shunt bulk acoustic resonator 21, and the at least one second shunt bulk acoustic resonator 22 may be implemented with a material having a relatively low resistivity, such as gold (Au), a gold-tin (Au—Sn) alloy, copper (Cu), a copper-tin (Cu—Sn) alloy, aluminum (Al), an aluminum alloy, and the like, but is not limited to these materials.

The at least one series bulk acoustic resonator 16, the at least one first shunt bulk acoustic resonator 21, and the at least one second shunt bulk acoustic resonator 22 may convert electrical energy of the RF signal into mechanical energy through piezoelectric characteristics, respectively, and inversely convert the same. As a frequency of the RF signal is closer to a resonance frequency of the bulk acoustic resonator, an energy transfer rate between a plurality of electrodes may be greatly increased. As the frequency of the RF signal is closer to an anti-resonance frequency of the bulk acoustic resonator, an energy transfer rate between a plurality of electrodes can be greatly reduced. According to the piezoelectric characteristics, an anti-resonance frequency may be higher than a resonance frequency.

The at least one series bulk acoustic resonator 16 may be electrically connected between the first and second ports P1 and P2 in series. As the frequency of the RF signal is closer to the resonance frequency, a pass rate between the first and second ports P1 and P2 of the RF signal can be increased. As the frequency of the RF signal is closer to the anti-resonance frequency, the pass rate between the first and second ports P1 and P2 of the RF signal may be reduced.

The at least one second shunt bulk acoustic resonator 22 may be electrically shunt connected between the at least one series bulk acoustic resonator 16 and a ground, and as a frequency of a RF signal is closer to a resonance frequency, a pass rate of the RF signal toward a ground may be increased, and as the frequency of the RF signal is closer to an anti-resonance frequency, the pass rate of the RF signal toward a ground may be lowered.

The pass rate between the first and second ports P1 and P2 of the RF signal may decrease as the pass rate of the RF signal toward the ground increases, and may increase as the pass rate of the RF signal toward the ground decreases.

That is, the pass rate between the first and second ports P1 and P2 of the RF signal may be lower closer to the resonance frequency of the at least one second shunt bulk acoustic resonator 22 or closer to the anti-resonance frequency of the at least one series bulk acoustic resonator 16.

Since the anti-resonance frequency is higher than the resonance frequency, a bulk acoustic resonator filter 50a may have a pass bandwidth formed of a lowest frequency corresponding to the resonance frequency of the at least one second shunt bulk acoustic resonator 22 and a highest frequency corresponding to the anti-resonance frequency of the at least one series bulk-acoustic resonator 16.

The pass bandwidth may be widened as a difference between the resonance frequency of the at least one second shunt bulk acoustic resonator 22 and the anti-resonance frequency of the at least one series bulk acoustic resonator 16 increases. However, if the difference is too large, the pass bandwidth may be split.

When the resonance frequency of the at least one bulk acoustic resonator 16 is appropriately higher than the anti-resonance frequency of the at least one second shunt bulk acoustic resonator 22, the bandwidth of the bulk acoustic resonator filter 50a may be wide and may not be split.

The difference between the resonance frequency and the anti-resonance frequency in the bulk acoustic resonator can be determined based on $kt^2$ (an electromechanical coupling factor), a physical characteristic of the bulk acoustic resonator, when the size or shape of the bulk acoustic resonator is changed, the resonance frequency and the anti-resonance frequency may be changed together.

The series portion 10a may include at least one series bulk acoustic resonator 16 electrically connected between the first and second ports P1 and P2 in series.

The first shunt portion 20f may be disposed in a first shunt connection path between the at least one series bulk acoustic resonator 16 and a ground, and may include the first and second shunt bulk acoustic resonators 21 and 22 connected to each other in series and having different resonance frequencies from each other. The resonance frequency of the first shunt bulk acoustic resonator 21 may be higher than the resonance frequency of the second shunt bulk acoustic resonator 22.

When the first and second shunt bulk acoustic resonators 21 and 22 are electrically connected to each other in series, since the first and second shunt bulk acoustic resonators 21 and 22 can act as capacitors with each other, the resonance frequency of each one can be increased. Accordingly, the resonance frequencies of the first and second shunt bulk acoustic resonators 21 and 22 may be closer to the anti-resonance frequencies of the first and second shunt bulk acoustic resonators 21 and 22.

Accordingly, a transmission zero pole can be formed near the resonance frequency of the first and second shunt bulk acoustic resonators 21 and 22, can be formed near a bandwidth of the bulk acoustic resonator filter 50a, and attenuation characteristics of the bandwidth can be improved. That is, the transmission zero pole may increase a change rate of admittance according to a change in frequency at the lowest frequency and/or the highest frequency of the bandwidth, and sharpen skirt characteristics of the bulk acoustic resonator filter 50a.

For example, the resonance frequency of the first shunt bulk acoustic resonator 21 may be greater than or equal to the resonance frequency of the at least one series bulk acoustic resonator 16. Accordingly, the skirt characteristics near the lowest frequency of the pass band of the bulk acoustic resonator filter 50a and the skirt characteristics near the highest frequency may together be sharpened.

FIGS. 1B to 1H are views illustrating a bulk acoustic resonator filter according various examples. A discussion of redundant elements may be omitted hereafter.

Figure 1B:
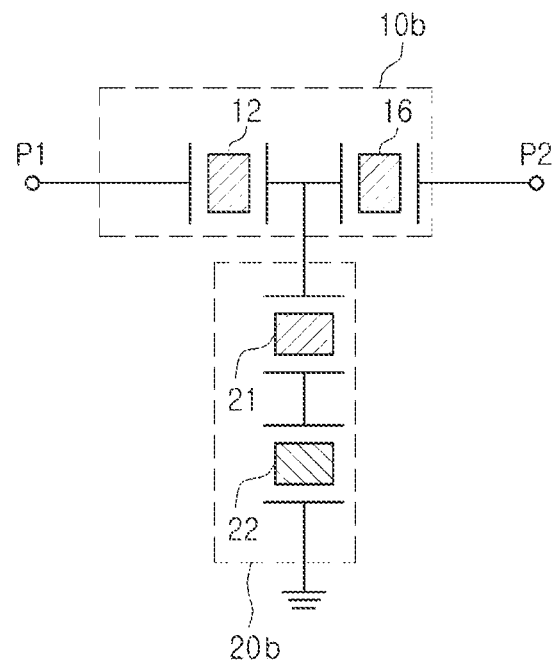
Figure 1C:
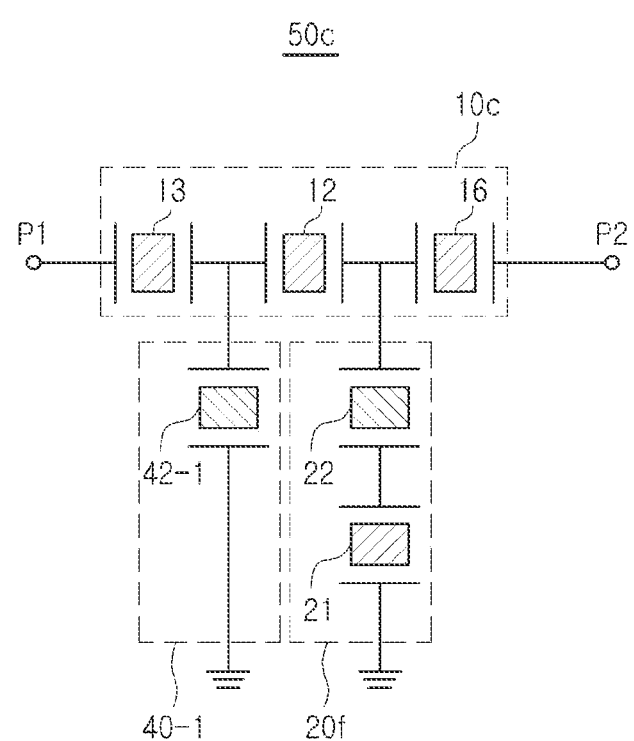

Referring to FIG. 1B, the number of at least one series bulk acoustic resonators 12 and 16 of a series portion 10b of a bulk acoustic resonator filter 50b may be plural, and a first shunt portion 20b may be electrically connected between a node between the plurality of series bulk acoustic resonators 12 and 16 in series and a ground. The number of the at least one series bulk acoustic resonators 12 and 16 may be appropriately set according to specifications required for the series bulk acoustic resonator filter 50b.

Referring to FIG. 1B, a connection position of the first and second shunt series bulk acoustic resonators 21 and 22 of the first shunt portion 20b may be different compared to those shown in FIG. 1A.

Referring to FIG. 10, a bulk acoustic resonators filter 50c may further include a second shunt portion 40-1.

The second shunt portion 40-1 may be disposed in a third shunt connection path between at least one series bulk acoustic resonators 12, 13, and 16 and a ground, and may include a second shunt bulk acoustic resonator 42-1 having a lower resonance frequency than a higher resonance frequency among a plurality of resonance frequencies of the first and second shunt bulk acoustic resonators 21 and 22 of a first shunt portion 20f.

Accordingly, a second shunt bulk acoustic resonator 42-1 of the second shunt portion 40-1 may form a pole near a lowest frequency of a bandwidth of the bulk acoustic resonator filter 50c, and skirt characteristics near the lowest frequency of the bandwidth of the acoustic resonator filter 50c may be sharper. For example, at least one resonance frequency of the second shunt bulk acoustic resonator 42-1 of the second shunt portion 40-1 may be the same as the lower resonance frequency among the plurality of resonance frequencies of the first and second shunt bulk acoustic resonators 21 and 22 of the first shunt portion 20f.

As the number of the plurality of series bulk acoustic resonators 12, 13, and 16 of a series portion 10c increases, skirt characteristics near the highest frequency of a bandwidth of a bulk acoustic resonator filter 50c may become sharper.

Figure 1D:
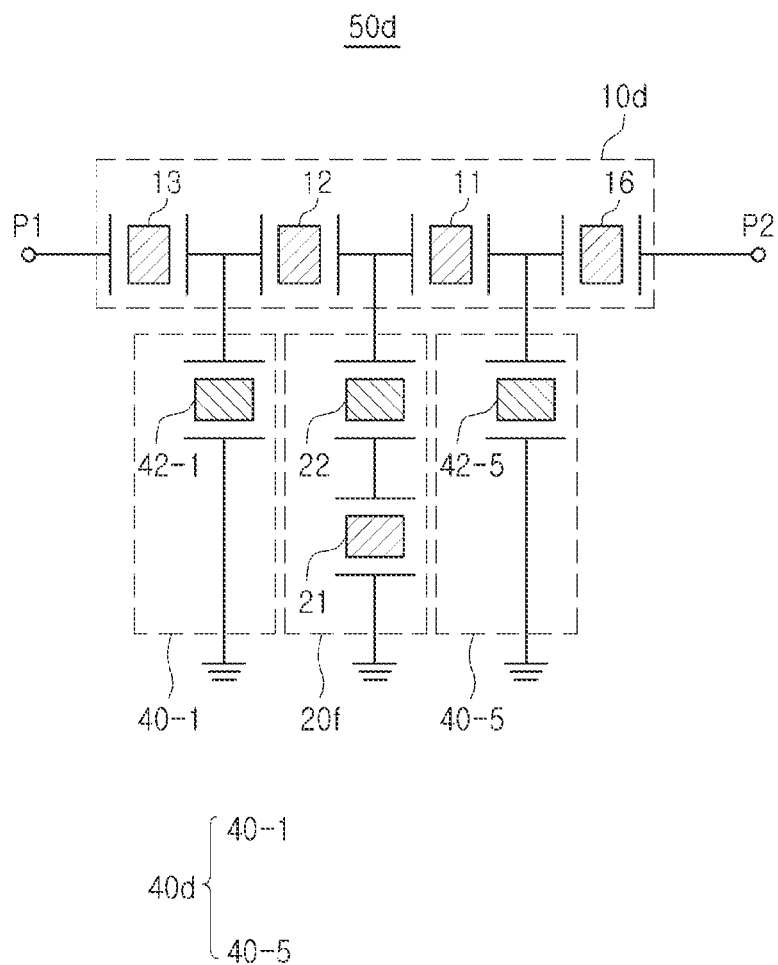

Referring to FIG. 1D, a second shunt portion 40d of a bulk acoustic resonator filter 50d may include a plurality of second shunt portions 40-1 and 40-5 respectively disposed on a plurality of third shunt connection paths between at least one of series bulk acoustic resonators 11, 12, 13, and 16 and a ground.

Each of the plurality of second shunt portions 40-1 and 40-5 may include second shunt bulk acoustic resonators 42-1 and 42-5 having a resonance frequency lower than the higher resonance frequency among the plurality of resonance frequencies of the first and second shunt bulk acoustic resonators 21 and 22 of the first shunt portion 20f.

A series portion 10d may include the series bulk acoustic resonators 11 and 12 electrically connected between the plurality of second shunt portions 40-1 and 40-5, and the first shunt portion 20f may be electrically connected between a node between the series bulk acoustic resonators 11 and 12 and a ground.

Accordingly, the first shunt portion 20f may be disposed farther from the first and second ports P1 and P2 than the plurality of second shunt portions 40-1 and 40-5, and may be relatively less affected by heat generation according to external noise or the power of the RF signal. Accordingly, the transmission zero pole formed by the first shunt portion 20f may be formed more stably (e.g., more robust to temperature changes), and the bulk acoustic resonator filter 50d can have more stable skirt characteristics.

Figure 1E:
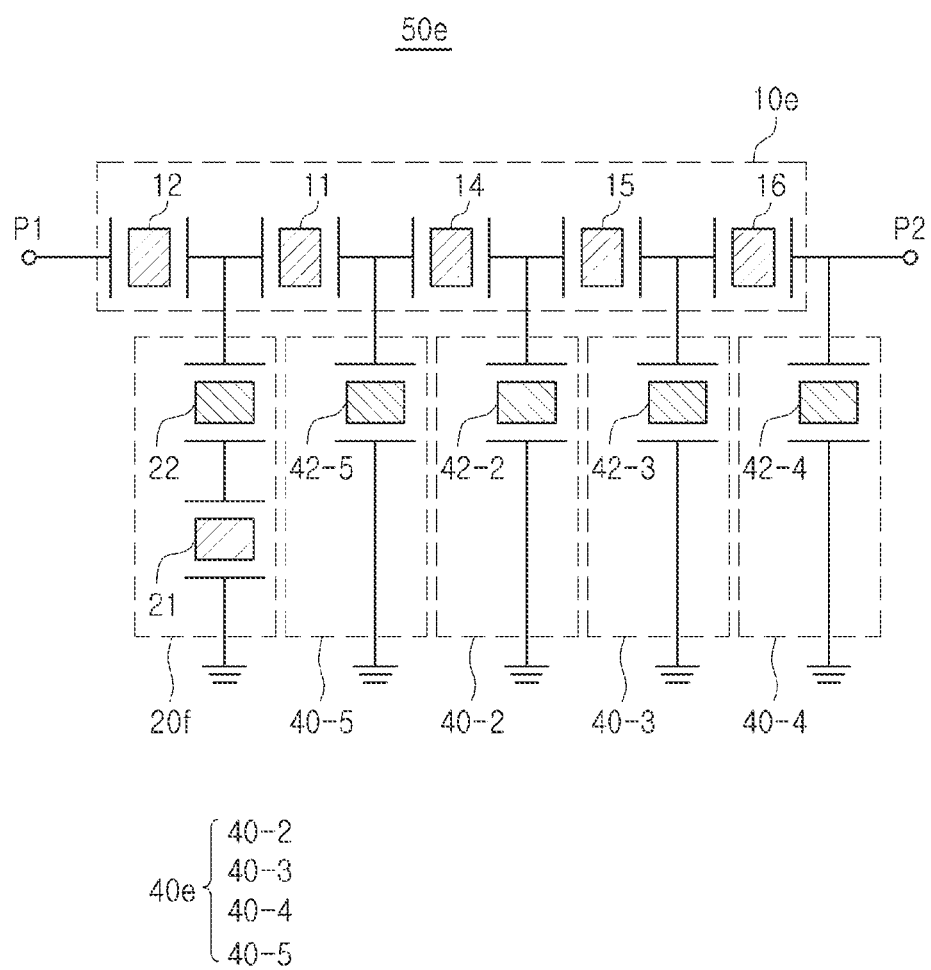

Referring to FIG. 1E, a second shunt portion 40e of a bulk acoustic resonator filter 50e may include a plurality of second shunt portions 40-2, 40-3, 40-4, and 40-5 including a plurality of second shunt bulk acoustic resonators 42-2, 42-3, and 42-4, and 42-5, and a series portion 10e may include a plurality of series bulk acoustic resonators 11, 12, 14, 15, and 16.

The number of the plurality of second shunt bulk acoustic resonators 22, 42-2, 42-3, 42-4, and 42-5 may be greater than the number of the first shunt bulk acoustic resonators 21.

Accordingly, the plurality of second shunt bulk acoustic resonators 22, 42-2, 42-3, 42-4, and 42-5 may form a main bandwidth of the bulk acoustic resonator filter 50e, and the plurality of first shunt bulk acoustic resonators 21 may sharpen the skirt characteristics of the main bandwidth of the bulk acoustic resonator filter 50e.

Figure 1F:
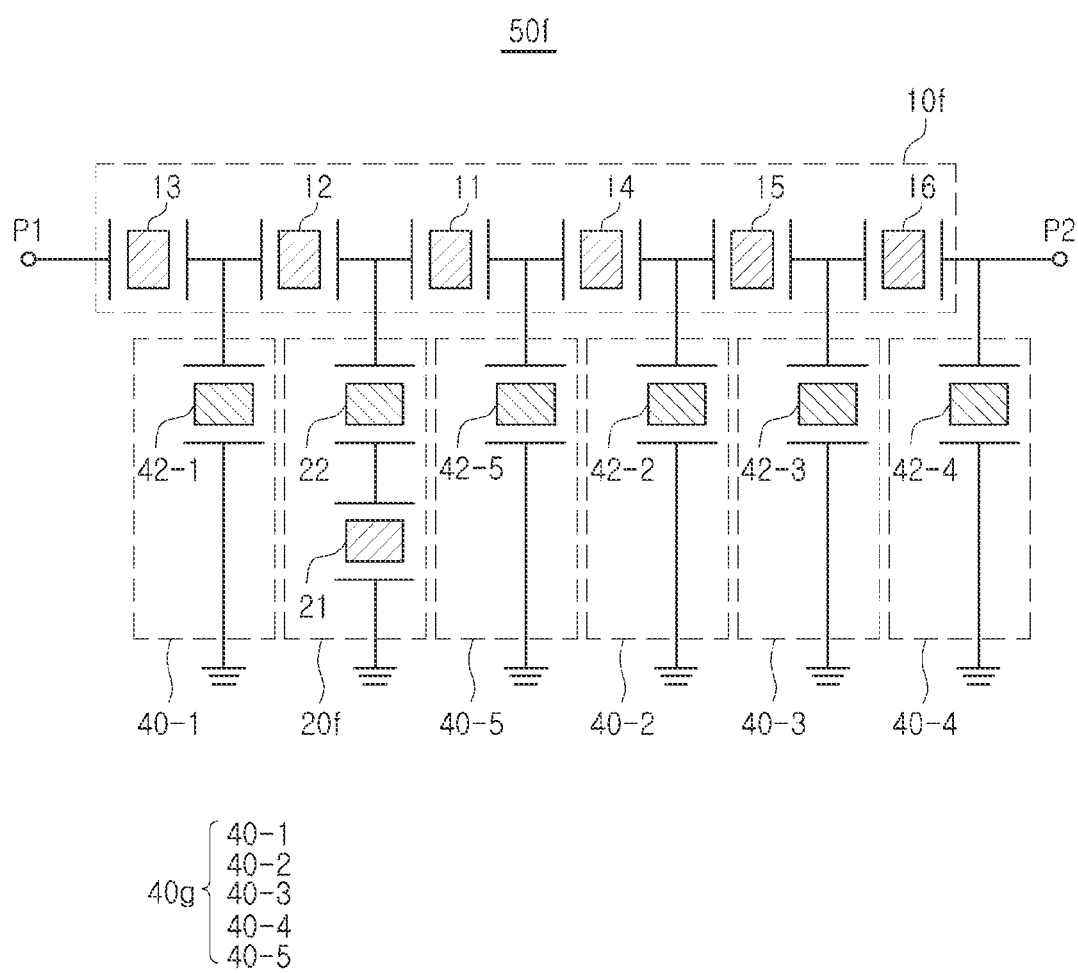

Referring to FIG. 1F, a second shunt portion 40g of a bulk acoustic resonator filter 50f may include a plurality of second shunt portions 40-1, 40-2, 40-3, 40-4, and 40-5 including a plurality of second shunt bulk acoustic resonators 42-1, 42-2, 42-3, 42-4, and 42-5, and a series portion 10f may include a plurality of series bulk acoustic resonators 11, 12, 13, 14, 15, and 16.

Figure 1G:
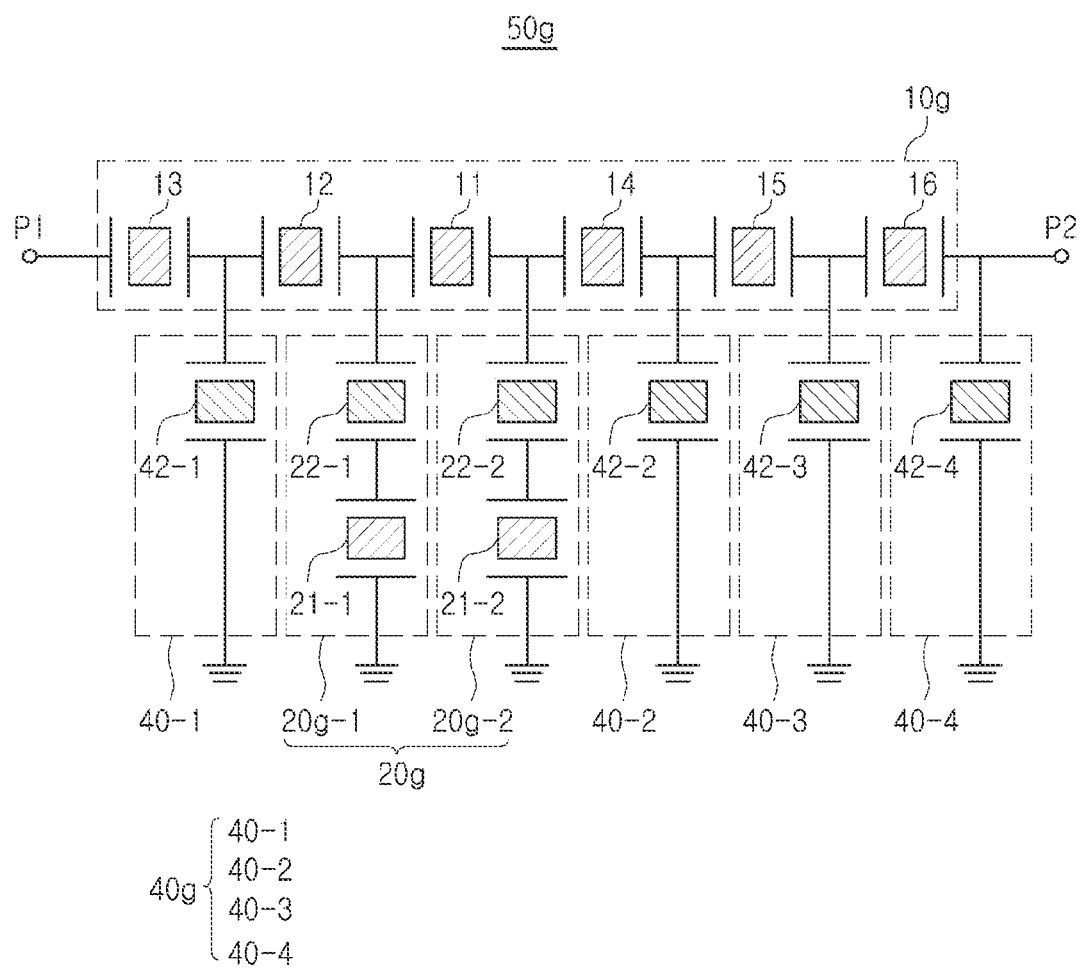

Referring to FIG. 1G, a first shunt portion 20g of a bulk acoustic resonator filter 50g may include a plurality of first shunt portions 20g-1 and 20g-2 disposed in a plurality of first shunt connection paths between at least one series bulk acoustic resonator 11, 12, 13, 14, 15, and 16 and a ground.

The plurality of first shunt portions 20g-1 and 20g-2 may include a plurality of first shunt bulk acoustic resonators 21-1 and 21-2 and a plurality of second shunt bulk acoustic resonators 22-1 and 22-2.

At least one series bulk acoustic resonator 11 among the plurality of series bulk acoustic resonators 11, 12, 13, 14, 15, and 16 of a series portion 10g may be electrically connected between the first shunt portions 20g-1 and 20g-2.

As the number of the plurality of first shunt bulk acoustic resonators 21-1 and 21-2 increases, the skirt characteristics of the bulk acoustic resonator filter 50g may become sharp.

Figure 1H:
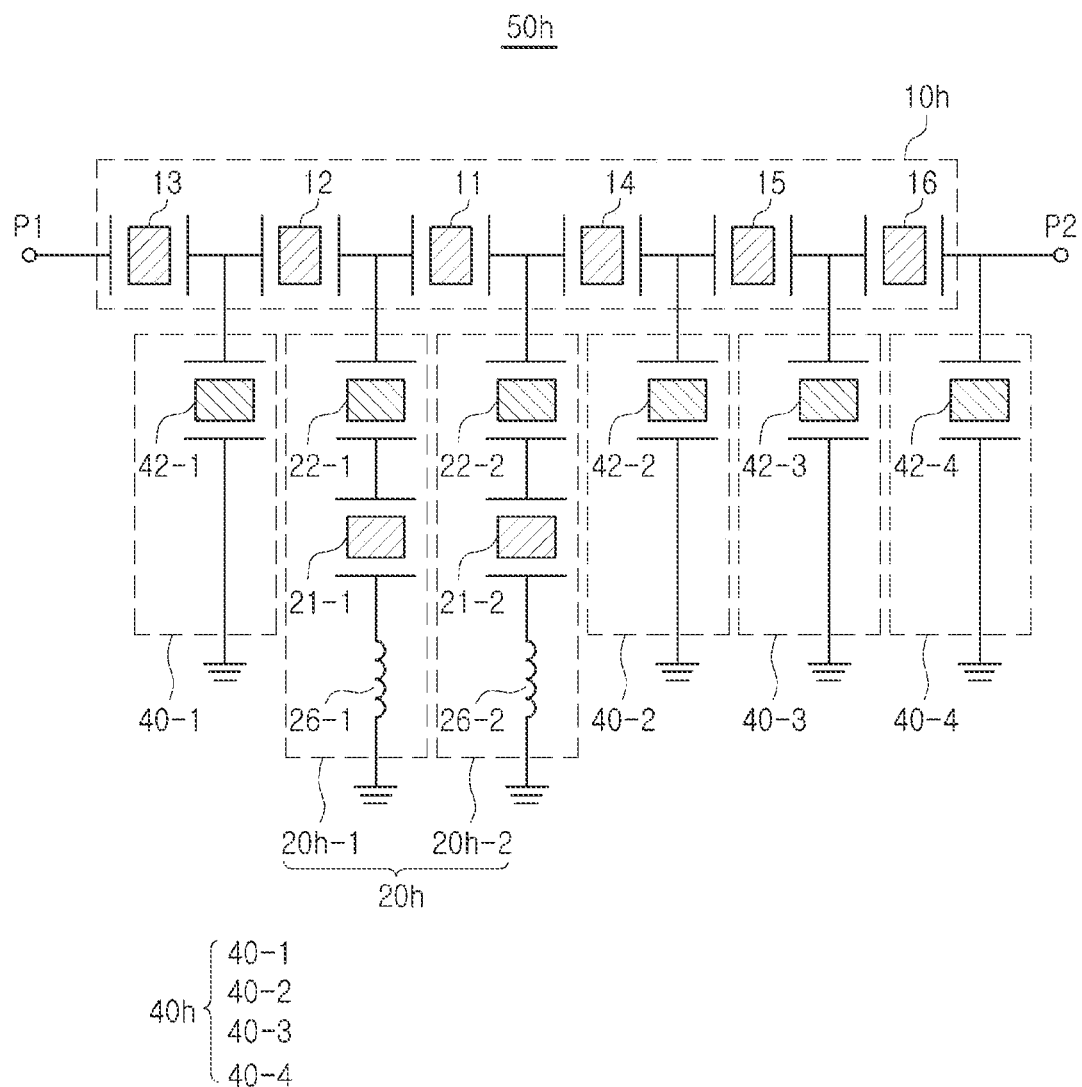

Referring to FIG. 1H, a plurality of first shunt portions 20h-1 and 20h-2 of a first shunt portion 20h of a bulk acoustic resonator filter 50h may include a plurality of inductors 26-1 and 26-2 electrically connected in series to the plurality of second shunt bulk acoustic resonators 22-1 and 22-2.

Additional inductance due the addition of the inductors 26-1 and 26-2 of the plurality of first shunt portions 20h-1 and 20h-2 may contribute to a resonance frequency of the plurality of first shunt portions 20h-1 and 20h-2, and may not substantially contribute to an anti-resonance frequency of the plurality of first shunt portions 20h-1 and 20-2. That is, the characteristics of the plurality of first shunt portions 20h-1 and 20h-2 having an increased inductance may be similar to the characteristics as $kt^2$ of the bulk acoustic resonator increases.

As $kt^2$ increases, since a difference between the resonance frequency and the anti-resonance frequency of the bulk acoustic resonator increases, the difference between the resonance frequency and the anti-resonance frequency of the plurality of first shunt portions 20h-1 and 20h-2 may be greater than those of a plurality of second shunt portions 40-1, 40-2, 40-3, and 40-4.

Since the difference between the resonance frequency and the anti-resonance frequency of the plurality of first shunt portions 20h-1 and 20h-2 is greater than those of the plurality of second shunt portions 40-1, 40-2, 40-3, and 40-4, it is possible to compensate for splitting of a pass bandwidth as a difference between the resonance frequency and the anti-resonance frequency of the plurality of series bulk acoustic resonators 11, 12, 13, 14, 15, and 16 of a series portion 10h becomes too high. Accordingly, the pass bandwidth of the bulk acoustic resonator filter 50h can be further widened.

Figure 2:
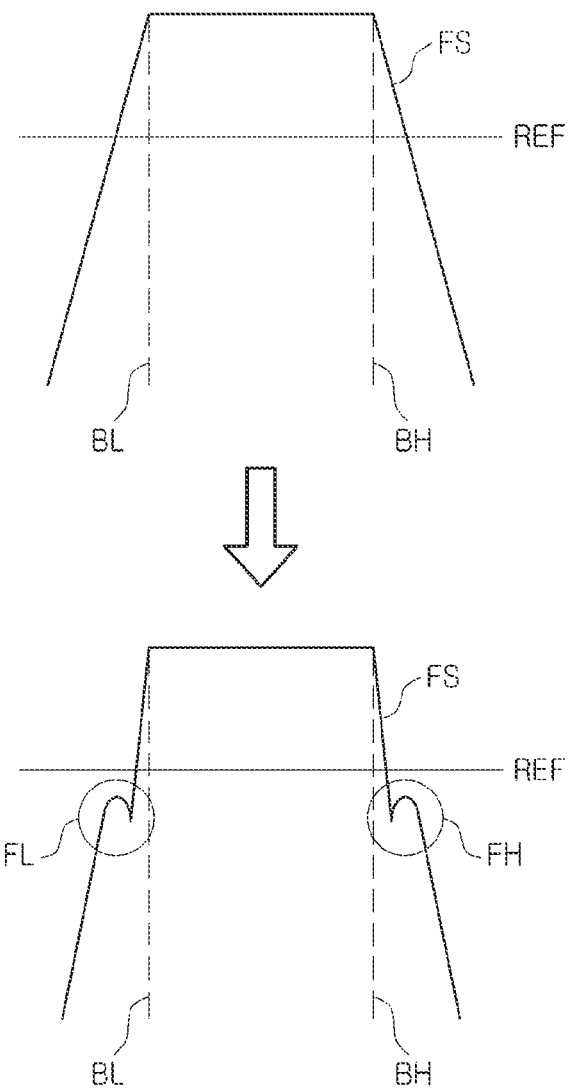
FIG. 2 is a view illustrating an attenuation pole formed by a serial connection of first and second shunt bulk acoustic resonators of a bulk acoustic resonator filter according to an example.

FIG. 2 is a view illustrating an attenuation pole formed by serial connection of first and second shunt bulk acoustic resonators of a bulk acoustic resonator filter according to an example.

Referring to FIG. 2, a frequency range, higher than a reference value REF in an S-parameter FS between a first port and a second port of a bulk acoustic resonator filter may be a bandwidth of the bulk acoustic resonator filter, and a slope from a lowest frequency BL and a highest frequency BH at which the S-parameter FS starts attenuation may be skirt characteristics of the bulk acoustic resonator filter.

A transmission zero pole formed by the first and second shunt acoustic resonators of the first shunt portion may correspond to attenuation poles FL and FH of the S-parameter FS.

The attenuation poles FL and FH can make the slope of the S-parameter FS from the lowest frequency BL and the highest frequency BH steeper.

Figure 3A:
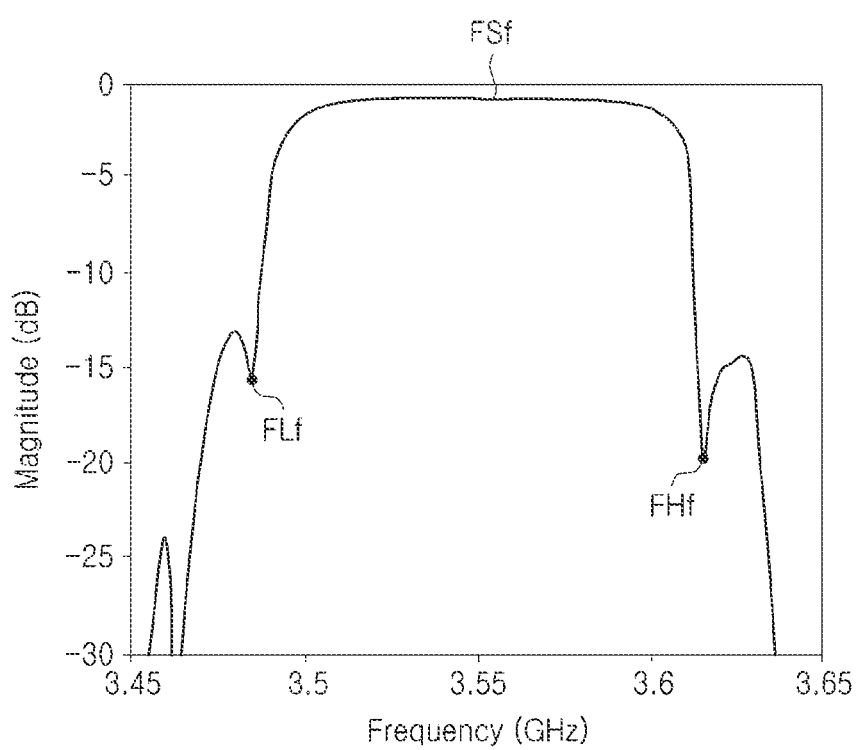
FIGS. 3A and 3B are graphs illustrating an S-parameter of the bulk acoustic resonator filter shown in FIG. 1F.
Figure 3B:
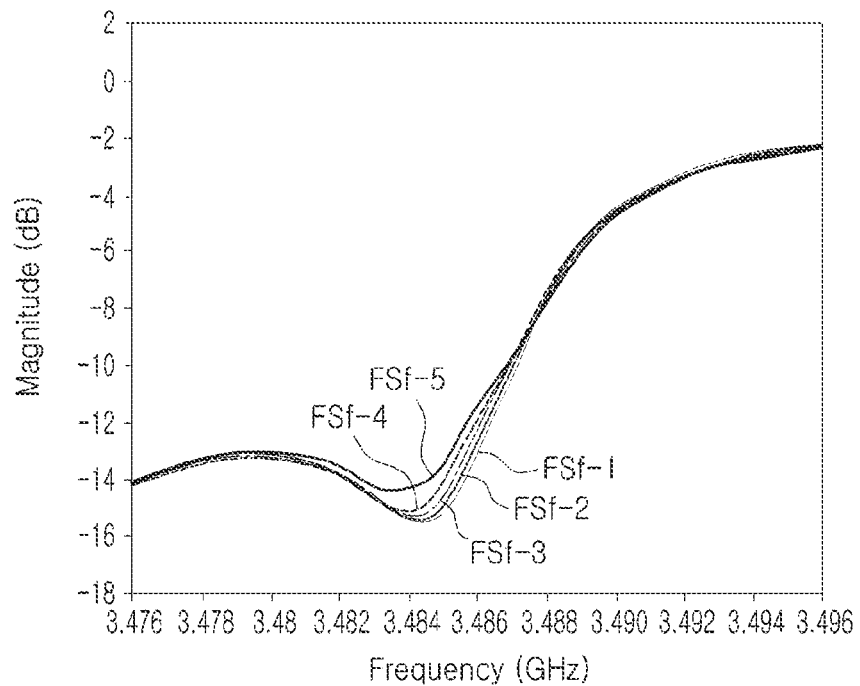

FIGS. 3A and 3B are graphs illustrating the S-parameter of the bulk acoustic resonator filter shown in FIG. 1F.

Referring to FIG. 3A, an S-parameter FSf between a first port and a second port of a bulk acoustic resonator filter may include attenuation poles FLf and FHf, and a bandwidth of the bulk acoustic resonator filter may be formed by a width of about 0.14 GHz at a center frequency of about 3.55 GHz. A lowest frequency of the bandwidth of the bulk acoustic resonator filter may be formed within 3.4 GHz to 3.6 GHz.

Figure 4A:
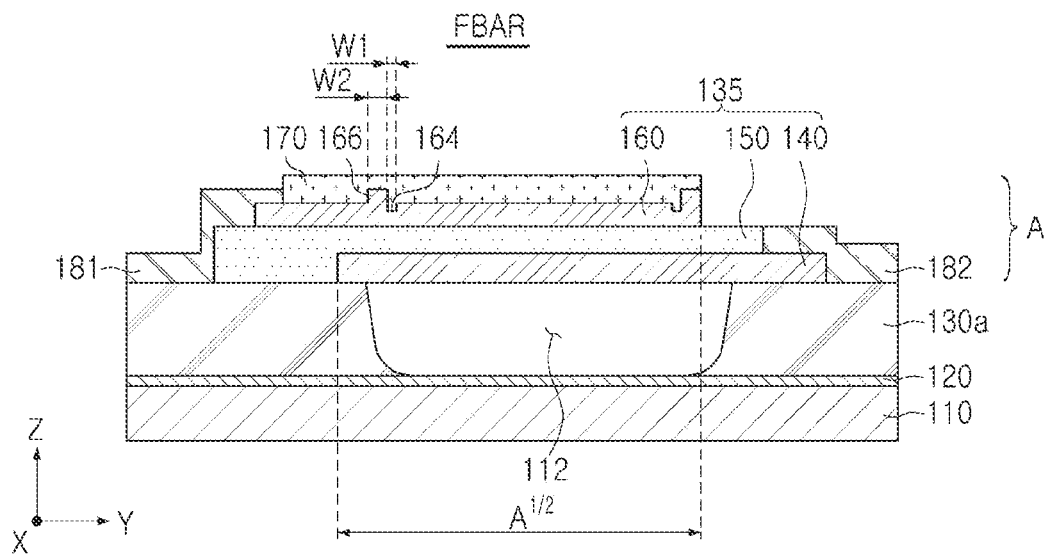
FIGS. 4A and 4B are diagrams illustrating a trench of a bulk acoustic resonator filter according to an example.
Figure 4B:
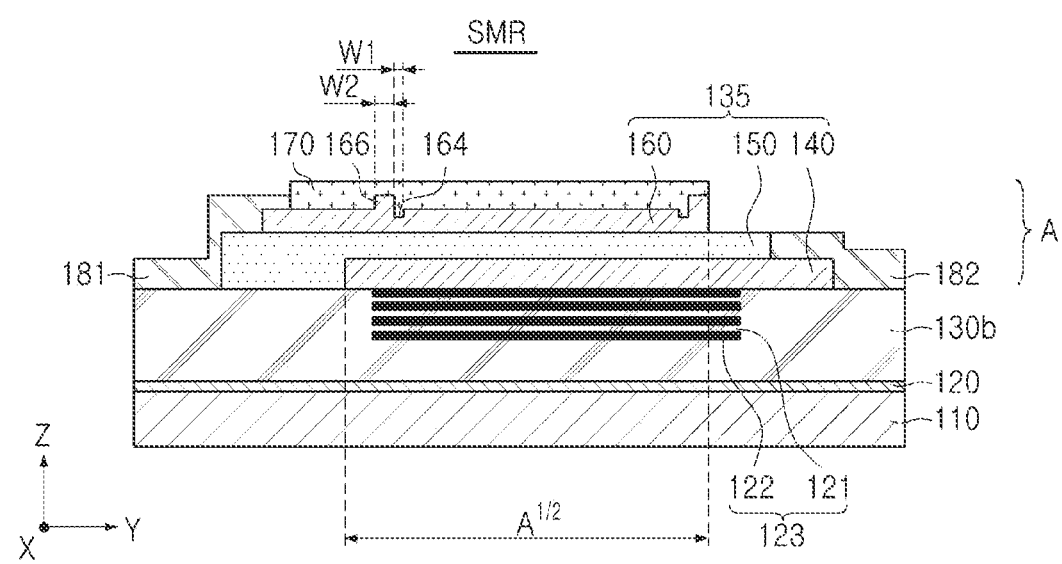

FIGS. 4A and 4B are views illustrating a trench of a bulk acoustic resonator filter according to an example.

Referring to FIG. 4A, a bulk acoustic resonator included in the bulk acoustic resonator filter may be a film bulk acoustic resonator (FBAR) in which a cavity 112 is positioned between a substrate 110 and a resonator 135.

Referring to FIG. 4B, a bulk acoustic resonator included in the bulk acoustic resonator filter according to an example may be a solidity mounted resonator (SMR) type resonator in which a support portion 123, in which at least one insulating layer 121 and at least one metal layer 122 are alternately stacked, is positioned between the substrate 110 and the resonator 135.

Referring to FIGS. 4A and 4B, the bulk acoustic resonator may include a resonator 135, may further include a protective layer 170 and/or metal layers 181 and 182, and may be disposed above the substrate 110, an insulating layer 120, and sacrificial layers 130a and 130b.

The resonator 135 may include a first electrode 140, a piezoelectric layer 150, and a second electrode 160. The first electrode 140 may be disposed above the substrate 110, the piezoelectric layer 150 may be disposed on the upper surface of the first electrode 140, and the second electrode 160 may be disposed on the upper surface of the piezoelectric layer 150.

The protective layer 170 may be disposed above the resonator 135, and the metal layers 181 and 182 may be disposed on the upper surface of the first or second electrodes 140 or 160, and may correspond to a node between the bulk acoustic resonators of the bulk acoustic resonator filters shown in FIGS. 1A to 1H.

Referring to FIGS. 4A and 4B, a series acoustic resonator and/or a first shunt acoustic resonator of the bulk acoustic resonator filter according to various examples may include the trench 164 formed on an upper surface or above the second electrode 160 to be recessed downwardly. For example, the trench 164 may have a form recessed toward the piezoelectric layer 150 on the upper surface of the second electrode 160, and may have a structure surrounding a center of the resonator 135 when viewed in the z direction.

Accordingly, since the attenuation pole shown in FIG. 3A can be formed more sharply, the S-parameter in the attenuation pole can be lowered more strongly, and the skirt characteristics of the bulk acoustic resonator filter can be sharper.

A plurality of curves of FIG. 3B represent an S-parameter near the lowest frequency of the bandwidth of the bulk acoustic resonator filter according to the presence or absence of a trench in the first shunt acoustic resonator of the first shunt portion or the trench width.

Referring to FIG. 3B, when the first shunt acoustic resonator of the first shunt portion does not include a trench, an attenuation pole FSf-5 may be formed to be relatively dull, but when the first shunt acoustic resonator of the first shunt portion includes a trench, attenuation poles FSf-1, FSf-2, FSf-3, and FSf-4 may be formed relatively sharply.

The sharper the attenuation poles FSf-1, FSf-2, FSf-3, and FSf-4, the steeper the slope of the S-parameter near the lowest frequency of the bandwidth of the bulk acoustic resonator filter.

Referring to FIGS. 4A and 4B, a width W1 of the trench 164 and a width A and a length ($A^{1/2}$) of the resonator 135 may be appropriately designed. Referring to FIG. 3B, sharpness of the attenuation poles FSf-1, FSf-2, FSf-3, and FSf-4 according to the width of the trench may vary.

The trench 164 may have greater influence on admittance in the lower frequency range than admittance in the frequency range higher than the resonance frequency of the acoustic resonator including the trench 164, and spurious noise in a frequency range, lower than the resonance frequency of the acoustic resonator may be reduced.

Since the lowest frequency of the bandwidth of the bulk acoustic resonator filter is lower than the relatively high resonance frequency of the series acoustic resonator and/or the first shunt acoustic resonator, the series acoustic resonator and/or the first shunt acoustic resonator may include a trench 164, such that spurious noise near the lowest frequency of the bandwidth may be reduced and the attenuation pole may be made to be sharper. That is, the skirt characteristics of the bulk acoustic resonator filter according to the various examples of the present disclosure may be sharper.

In addition, since the resonance frequency of the series acoustic resonator and/or the first shunt acoustic resonator may be lower than the highest frequency of a bandwidth, a frequency range, lower than the resonance frequency of the series acoustic resonator and/or the first shunt acoustic resonator may belong to the bandwidth. Therefore, spurious noise of the bandwidth may be reduced, and an insertion loss and/or a pass band ripple characteristic of the bulk acoustic resonator filter according to the various examples of the present disclosure may be further reduced.

Figure 3C:
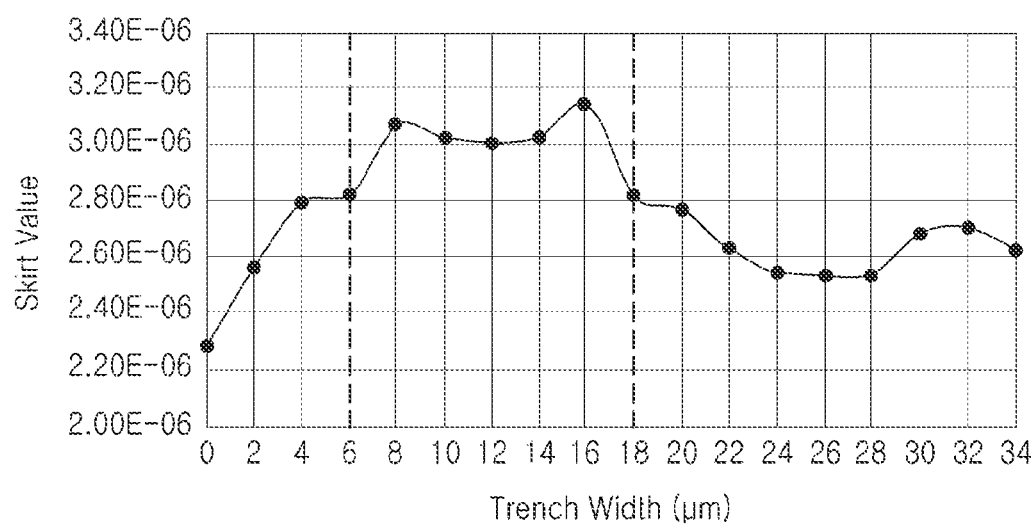
FIG. 3C is a graph illustrating the skirt characteristics of the bulk acoustic resonator filter shown in FIG. 1F.

FIG. 3C is a graph illustrating skirt characteristics of the bulk acoustic resonator filter shown in FIG. 1F.

Referring to FIG. 3C, in the S-parameter of FIG. 3B, a slope (skirt value) of a frequency range of 3.48 GHz to 3.50 GHz may vary according to a trench width.

The slope (skirt value) may be the largest when the trench width is 0.6 μm or more and 1.8 μm or less. That is, the series acoustic resonator and/or the first shunt acoustic resonator of the bulk acoustic resonator filter according to an example may include a trench having a width of 0.6 μm or more and 1.8 μm or less. Accordingly, the skirt characteristics of the bulk acoustic resonator filter may be sharper.

Since graphs of FIGS. 3B and 3C show an S-parameter in a state in which A, an area of overlap of the first electrode, the piezoelectric layer, and the second electrode is set to (70 μm)$^2$, W/A may be 0.6/4900 (μm/(μm)$^2$) or more and 1.8/4900 (μm/(μm)$^2$) or less, where W (W1 in FIGS. 4A and 4B) is the width of the trench. That is, W can be longer as A is larger.

In FIG. 3B, since attenuation poles FSf-1, FSf-2, FSf-3, and FSf-4 are formed at 3.485 GHz, W*F may be 0.6*3.485 (μm*GHz) or more and 1.8*3.485 (μm*GHz) or less.

Here, F is a frequency of the attenuation pole. That is, W may be shorter as F is higher. Accordingly, the skirt characteristics of the bulk acoustic resonator filter may be sharper.

Depending on the design, referring to FIGS. 4A and 4B, the second electrode 160 may include a frame 166 protruding upwardly on the upper surface of the second electrode 160. A width W1 of the trench 164 may be shorter than a width W2 of the frame 166. The width W1 of the trench 164 may be longer than a depth of the trench. The depth of the trench may exceed 0 nm and be 100 nm or less.

Depending on the design, a shape of a cross-section of the trench 164 may not be rectangular, and the width of the upper portion and the lower portion of the trench 164 may be different from each other. Here, the width W1 of the trench 164 may be defined as an average value of the widths of the upper and lower portions of the trench 164, and may be defined as a value obtained by dividing a height by an integral value of the widths from the upper to lower portions of the trench 164.

Depending on the design, the second shunt acoustic resonator of the bulk acoustic resonator filter may include a trench substantially equal to the trench 164 of the series acoustic resonator and/or the first shunt acoustic resonator, and may include a trench having a width, different from the width W1 of the trench 164, or may not include a trench.

For example, the width W1 and depth of the trench may be measured by analysis using at least one of a Transmission Electron Microscopy (TEM), an Atomic Force Microscope (AFM), and a surface profiler for the intersect-section of the bulk acoustic resonator.

Figure 5A:
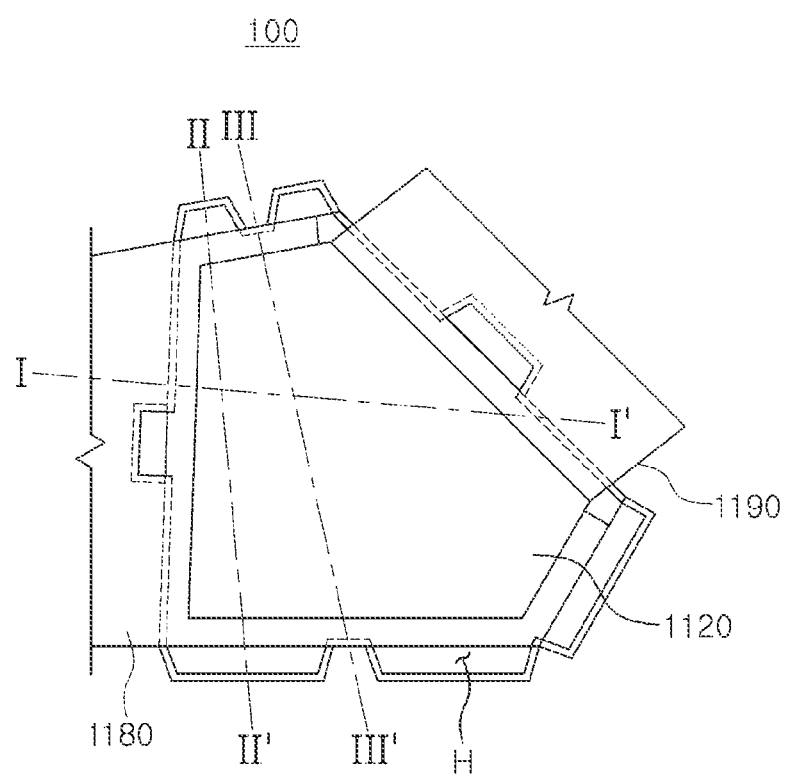
FIG. 5A is a plan view illustrating a detailed structure of a bulk acoustic resonator that can be included in a bulk acoustic resonator filter according to an example.
Figure 5B:
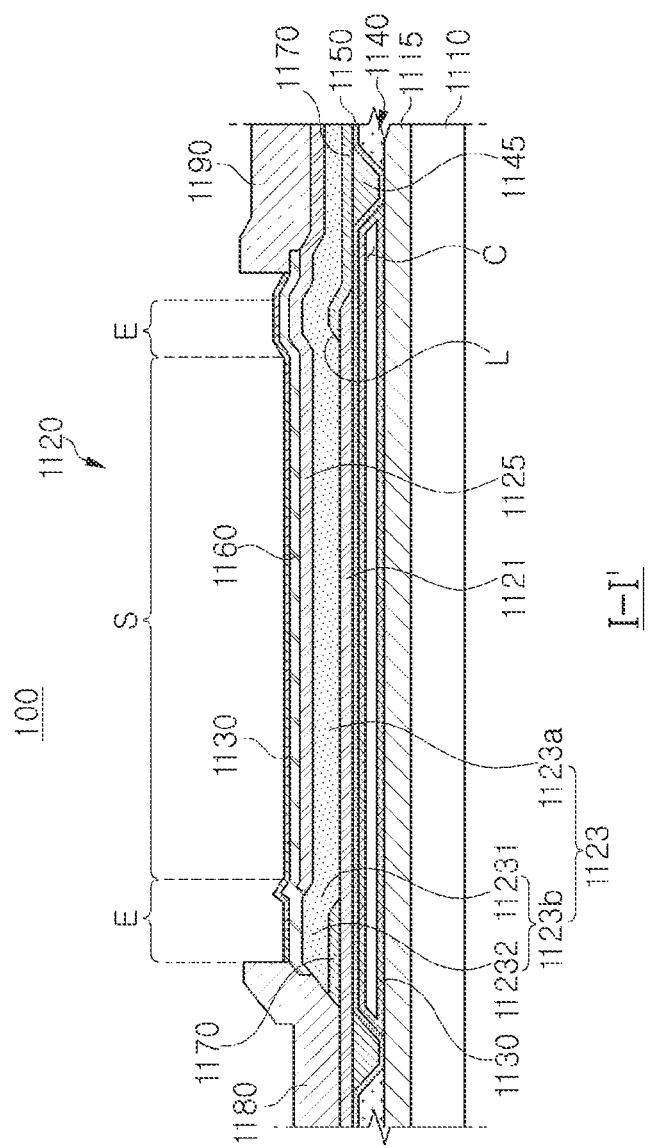
FIG. 5B is an intersect-sectional view taken along line I-I' of FIG. 5A.
Figure 5C:
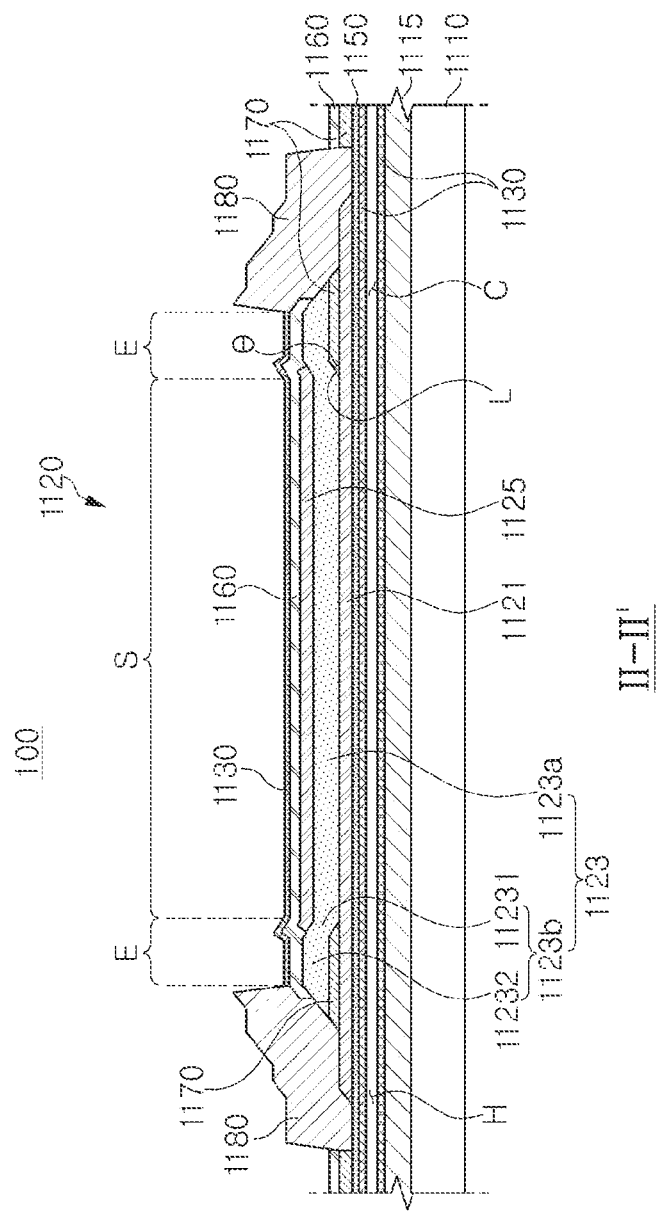
FIG. 5C is an intersect-sectional view taken along line II-II' of FIG. 5A.
Figure 5D:
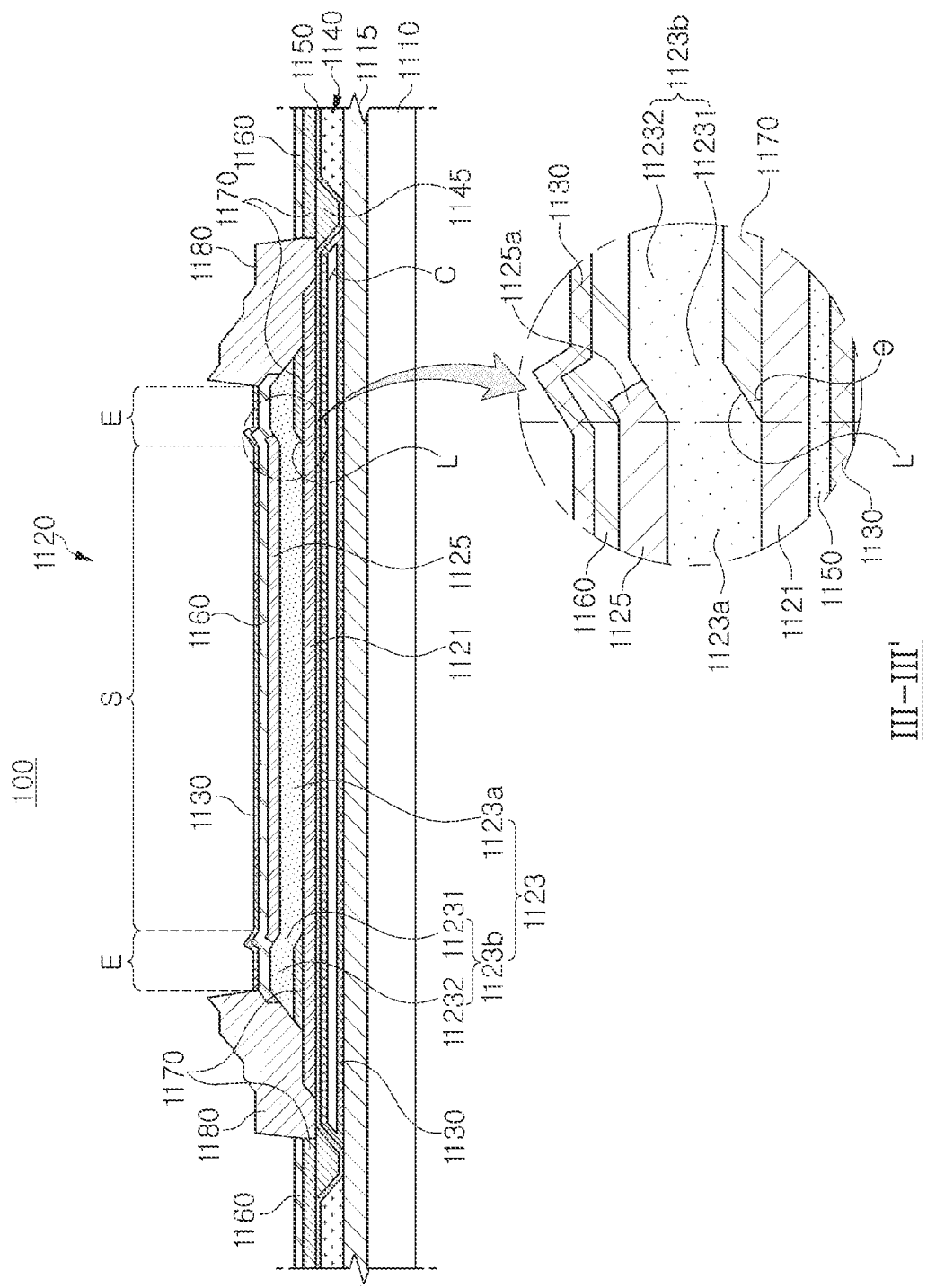
FIG. 5D is an intersect-sectional view taken along line III-III' of FIG. 5A.

FIG. 5A is a plan view illustrating a detailed structure of a bulk acoustic resonator that can be included in a bulk acoustic resonator filter according to an example, FIG. 5B is a intersect-sectional view taken along line I-I' of FIG. 5A, FIG. 5C is a intersect-sectional view taken along line II-II' of FIG. 5A, and FIG. 5D is a intersect-sectional view taken along line III-III' of FIG. 5A.

Referring to FIGS. 5A to 5D, a bulk acoustic resonator 100 may include a support substrate 1110, an insulating layer 1115, a resonator 1120, and a hydrophobic layer 1130.

The support substrate 1110 may be a silicon substrate. For example, a silicon wafer may be used as the support substrate 1110, or a silicon on insulator (SOI) type substrate may be used.

The insulating layer 1115 may be provided on an upper surface of the substrate 1110 to electrically isolate the support substrate 1110 and the resonator 1120. In addition, the insulating layer 1115 prevents the support substrate 1110 from being etched by an etching gas when a cavity C is formed in a manufacturing process of the bulk acoustic resonator.

In this case, the insulating layer 1115 may be formed of at least one of silicon dioxide ($SiO_2$), silicon nitride ($Si_3N_4$), aluminum oxide ($Al_2O_3$), and aluminum nitride (AlN), and may be formed through any one process of chemical vapor deposition, RF magnetron sputtering, and evaporation.

A support layer 1140 may be formed on the insulating layer 1115, and may be disposed around the cavity C and an etch stop portion 1145 in a form surrounding the cavity C and the etch stop portion 1145 inside the support layer 1140.

The cavity C may be formed as an empty space, and may be formed by removing a portion of a sacrificial layer formed in a process of providing the support layer 1140, and the support layer 1140 may be formed as a portion remaining of the sacrificial layer.

The support layer 1140 may be formed of a material such as polysilicon or a polymer that is easy for etching. However, it is not limited to these materials.

The etch stop portion 1145 is disposed along a boundary of the cavity C. The etch stop portion 1145 is provided to prevent etching from being performed beyond a cavity region in a process of forming the cavity C.

A membrane layer 1150 is formed on the support layer 1140, and forms an upper surface of the cavity C. Therefore, the membrane layer 1150 is also formed of a material that is not easily removed in the process of forming the cavity C.

For example, when a halide-based etching gas such as fluorine (F), chlorine (Cl), or the like is used to remove a portion (e.g., a cavity region) of the support layer 1140, the membrane layer 1150 may be made of a material having low reactivity with the etching gas. In this case, the membrane layer 1150 may include at least one of silicon dioxide ($SiO_2$) and silicon nitride ($Si_3N_4$).

In addition, the membrane layer 1150 may be made of a dielectric layer containing at least one material of magnesium oxide (MgO), zirconium oxide ($ZrO_2$), aluminum nitride (AlN), lead zirconate titanate (PZT), gallium arsenide (GaAs), hafnium oxide ($HfO_2$), and aluminum oxide ($Al_2O_3$), titanium oxide ($TiO_2$), and zinc oxide (ZnO), or a metal layer containing at least one material of aluminum (Al), nickel (Ni), chromium (Cr), platinum (Pt), gallium (Ga), and hafnium (Hf). However, the configuration is not limited thereto.

The resonator 1120 includes a first electrode 1121, a piezoelectric layer 1123, and a second electrode 1125. The resonator 1120 is configured such that the first electrode 1121, the piezoelectric layer 1123, and the second electrode 1125 are stacked in order from a bottom. Therefore, the piezoelectric layer 1123 in the resonator 1120 is disposed between the first electrode 1121 and the second electrode 1125.

Since the resonator 1120 is formed on the membrane layer 1150, the membrane layer 1150, the first electrode 1121, the piezoelectric layer 1123, and the second electrode 1125 are sequentially stacked on the support substrate 1110, to form the resonator 1120.

The resonator 1120 may resonate the piezoelectric layer 1123 according to signals applied to the first electrode 1121 and the second electrode 1125 to generate a resonance frequency and an anti-resonance frequency.

The resonator 1120 may be divided into a central portion S in which the first electrode 1121, the piezoelectric layer 1123, and the second electrode 1125 are stacked to be substantially flat, and an extension portion E in which an insertion layer 1170 is interposed between the first electrode 1121 and the piezoelectric layer 1123.

The central portion S is a region disposed in a center of the resonator 1120, and the extension portion E is a region disposed along a periphery of the central portion S. Therefore, the extension portion E is a region extended from the central portion S externally, and refers to a region formed to have a continuous annular shape along the periphery of the central portion S. However, if necessary, the extension portion E may be configured to have a discontinuous annular shape, in which some regions are disconnected.

Accordingly, as shown in FIG. 5B, in the intersect-section of the resonator 1120 cut so as to intersect the central portion S, the extension portion E is disposed at both ends of the central portion S, respectively. The insertion layer 1170 is disposed on both sides of the central portion S of the extension portion E disposed at both ends of the central portion S.

The insertion layer 1170 has an inclined surface L of which a thickness becomes greater as a distance from the central portion S increases.

In the extension portion E, the piezoelectric layer 1123 and the second electrode 1125 are disposed on the insertion layer 1170. Therefore, the piezoelectric layer 1123 and the second electrode 1125 located in the extension portion E have an inclined surface along the shape of the insertion layer 1170.

It is described that the extension portion E is included in the resonator 1120, and accordingly, resonance may also occur in the extension portion E. However, the various examples are not limited thereto, and resonance may not occur in the extension portion E depending on the structure of the extension portion E, but resonance may occur only in the central portion S.

The first electrode 1121 and the second electrode 1125 may be formed of a conductor, for example, may be formed of gold, molybdenum, ruthenium, iridium, aluminum, platinum, titanium, tungsten, palladium, tantalum, chromium, nickel, or a metal containing at least one thereof, but is not limited to such materials.

In the resonator 1120, the first electrode 1121 is formed to have a larger area than the second electrode 1125, and a first metal layer 1180 is disposed on the first electrode 1121 along an outer periphery of the first electrode 1121. Therefore, the first metal layer 1180 may be disposed to be spaced apart from the second electrode 1125 by a predetermined distance, and may be disposed in a form surrounding the resonator 1120.

Since the first electrode 1121 is disposed on the membrane layer 1150, the first electrode 1121 is formed to be entirely flat. On the other hand, since the second electrode 1125 is disposed on the piezoelectric layer 1123, curving may be formed corresponding to the shape of the piezoelectric layer 1123.

The first electrode 1121 may be used as any one of an input electrode and an output electrode for inputting and outputting an electrical signal such as a radio frequency (RF) signal.

The second electrode 1125 is entirely disposed in the central portion S, and partially disposed in the extension portion E. Accordingly, the second electrode 1125 may be divided into a portion disposed on a piezoelectric portion 1123a of the piezoelectric layer 1123 (to be described later), and a portion disposed on a curved portion 1123b of the piezoelectric layer 1123.

For example, the second electrode 1125 may be disposed to cover an entirety of the piezoelectric portion 1123a and a portion of an inclined portion 11231 of the piezoelectric layer 1123. Accordingly, the second electrode (1125a in FIG. 5D) disposed in the extension portion E is formed to have a smaller area than an inclined surface of the inclined portion 11231, and the second electrode 1125 in the resonator 1120 is formed to have a smaller area than the piezoelectric layer 1123.

Accordingly, as shown in FIG. 5B, in a intersect-section of the resonator 1120 cut so as to intersect the central portion S, an end of the second electrode 1125 is disposed in the extension portion E. In addition, at least a portion of the end of the second electrode 1125 disposed in the extension portion E is disposed to overlap the insertion layer 1170. Here, 'overlap' means that when the second electrode 1125 is projected on a plane on which the insertion layer 1170 is disposed, a shape of the second electrode 1125 projected on the plane overlaps the insertion layer 1170.

The second electrode 1125 may be used as any one of an input electrode and an output electrode for inputting and outputting an electrical signal such as a radio frequency (RF) signal, or the like. That is, when the first electrode 1121 is used as the input electrode, the second electrode 1125 may be used as the output electrode, and when the first electrode 1121 is used as the output electrode, the second electrode 1125 may be used as the input electrode.

As shown in FIG. 5D, when the end of the second electrode 1125 is positioned on the inclined portion 11231 of the piezoelectric layer 1123, since a local structure of an acoustic impedance of the resonator 1120 is formed in a sparse/dense/sparse/dense structure from the central portion S, a reflective interface reflecting a lateral wave inwardly of the resonator 1120 is increased. Therefore, since most lateral waves could not flow outwardly of the resonator 1120, and are reflected and then flow to an interior of the resonator 1120, the performance of the acoustic resonator may be improved.

The piezoelectric layer 1123 is a portion converting electrical energy into mechanical energy in a form of elastic waves through a piezoelectric effect, and is formed on the first electrode 1121 and the insertion layer 1170.

As a material of the piezoelectric layer 1123, zinc oxide (ZnO), aluminum nitride (AlN), doped aluminum nitride, lead zirconate titanate, quartz, and the like can be selectively used. In the case of doped aluminum nitride, a rare earth metal, a transition metal, or an alkaline earth metal may be further included. The rare earth metal may include at least one of scandium (Sc), erbium (Er), yttrium (Y), and lanthanum (La). The transition metal may include at least one of hafnium (Hf), titanium (Ti), zirconium (Zr), tantalum (Ta), and niobium (Nb). In addition, the alkaline earth metal may include magnesium (Mg).

In order to improve piezoelectric properties, when a content of elements doped with aluminum nitride (AlN) is less than 0.1 at %, a piezoelectric property higher than that of aluminum nitride (AlN) cannot be realized. When the content of the elements exceeds 30 at %, it is difficult to fabricate and control the composition for deposition, such that uneven crystalline phases may be formed.

Therefore, the content of elements doped with aluminum nitride (AlN) may be in a range of 0.1 to 30 at %.

The piezoelectric layer 1123 may be doped with scandium (Sc) in aluminum nitride (AlN). In this case, a piezoelectric constant may be increased to increase $Kt^2$ of the acoustic resonator.

The piezoelectric layer 1123 may include the piezoelectric portion 1123a disposed in the central portion S and the curved portion 1123b disposed in the extension portion E.

The piezoelectric portion 1123a is a portion directly stacked on the upper surface of the first electrode 1121. Therefore, the piezoelectric portion 1123a is interposed between the first electrode 1121 and the second electrode 1125 to be formed to have a flat shape, together with the first electrode 1121 and the second electrode 1125.

The curved portion 1123b may be defined as a region extending externally from the piezoelectric portion 1123a and positioned in the extension portion E.

The curved portion 1123b is disposed on the insertion layer 1170, and is formed in a shape in which the upper surface thereof is raised along the shape of the insertion layer 1170. Accordingly, the piezoelectric layer 1123 is curved at a boundary between the piezoelectric portion 1123a and the curved portion 1123b, and the curved portion 1123b is raised corresponding to the thickness and shape of the insertion layer 1170.

The curved portion 1123b may be divided into the inclined portion 11231 and an extension portion 11232. The inclined portion 11231 refers to a portion formed to be inclined along the inclined surface L of the insertion layer 1170. The extension portion 11232 refers to a portion extending externally from the inclined portion 11231. The inclined portion 11231 is formed parallel to the inclined surface L of the insertion layer 1170, and an angle of inclination of the inclined portion 11231 may be formed to be the same as an angle of inclination of the inclined surface L of the insertion layer 1170.

The insertion layer 1170 is disposed along a surface formed by the membrane layer 1150, the first electrode 1121, and the etch stop portion 1145. Therefore, the insertion layer 1170 is partially disposed in the resonator 1120, and is disposed between the first electrode 1121 and the piezoelectric layer 1123.

The insertion layer 1170 is disposed around the central portion S to support the curved portion 1123b of the piezoelectric layer 1123. Accordingly, the curved portion 1123b of the piezoelectric layer 1123 may be divided into the inclined portion 11231 and the extension portion 11232 according to the shape of the insertion layer 1170.

The insertion layer 1170 may be disposed in a region except for the central portion S. For example, the insertion layer 1170 may be disposed on the support substrate 1110 in an entire region except for the central portion S, or in some regions.

The insertion layer 1170 is formed to have a thickness becoming greater as a distance from the central portion S increases. Thereby, the insertion layer 1170 is formed of an inclined surface L having a constant angle of inclination $\theta$ of the side surface disposed adjacent to the central portion S.

When the angle of inclination $\theta$ of the side surface of the insertion layer 1170 is formed to be smaller than 5°, in order to manufacture it, since the thickness of the insertion layer 1170 may be formed to be very thin or an area of the inclined surface L may be formed to be large.

In addition, when the angle of inclination $\theta$ of the side surface of the insertion layer 1170 is formed to be greater than 70°, the angle of inclination of the piezoelectric layer 1123 or the second electrode 1125 stacked on the insertion layer 1170 is also formed to be greater than 70°. In this case, since the piezoelectric layer 1123 or the second electrode 1125 stacked on the inclined surface L is excessively curved, cracks may be generated in the curved portion.

Therefore, the angle of inclination $\theta$ of the inclined surface L may be formed in a range of 5° or more and 70° or less.

Meanwhile, the inclined portion 11231 of the piezoelectric layer 1123 is formed along the inclined surface L of the insertion layer 1170, and thus is formed to have the same angle of inclination as the inclined surface L of the insertion layer 1170. Therefore, the angle of inclination of the inclined portion 11231 is also formed in a range of 5° or more and 70° or less, similarly to the inclined surface L of the insertion layer 1170. The configuration may also be equally applied to the second electrode 1125 stacked on the inclined surface L of the insertion layer 1170.

The insertion layer 1170 may be formed of a dielectric material such as silicon oxide ($SiO_2$), nitride aluminum (AlN), aluminum oxide ($Al_2O_3$), silicon nitride ($Si_3N_4$), magnesium oxide (MgO), zirconium oxide ($ZrO_2$), lead zirconate titanate (PZT), gallium arsenide (GaAs), hafnium oxide ($HfO_2$), titanium oxide ($TiO_2$), and zinc oxide (ZnO), but may be formed of a material, different from that of the piezoelectric layer 1123.

In addition, the insertion layer 1170 may be implemented with a metal material. When a bulk acoustic resonator is used for 5G communications, heat generated from the resonator 1120 needs to be smoothly discharged because a lot of heat is generated from the resonator. To this end, the insertion layer 1170 may be made of an aluminum alloy material containing scandium (Sc).

The resonator 1120 is disposed to be spaced apart from the support substrate 1110 through the cavity C formed as an empty space.

The cavity C may be formed by removing a portion of the support layer 1140 by supplying an etching gas (or an etching solution) to an inlet hole (H in FIG. 5A) in a process of manufacturing the bulk acoustic resonator.

Accordingly, the cavity C is composed of a space in which an upper surface (a ceiling surface) and a side surface (a wall surface) are formed by the membrane layer 1150, and a bottom surface thereof is formed by the support substrate 1110 or the insulating layer 1115. Meanwhile, the membrane layer 1150 may be formed only on the upper surface (the ceiling surface) of the cavity C according to the order of the manufacturing method.

A protective layer 1160 is disposed along the surface of the bulk acoustic resonator 100 to protect the acoustic resonator 100 externally. The protective layer 1160 may be disposed along a surface formed by the second electrode 1125 and the curved portion 1123b of the piezoelectric layer 1123.

The protective layer 1160 may be partially removed for frequency control in a final process during the manufacturing process. For example, the thickness of the protective layer 1160 may be controlled through frequency trimming during the manufacturing process.

To this end, the protective layer 1160 may include one of silicon oxide ($SiO_2$), silicon nitride ($Si_3N_4$), magnesium oxide (MgO), zirconium oxide ($ZrO_2$), aluminum nitride (AlN), lead zirconate titanate (PZT), gallium Arsenic (GaAs), hafnium oxide ($HfO_2$), aluminum oxide ($Al_2O_3$), titanium oxide ($TiO_2$), zinc oxide (ZnO), amorphous silicon (a-Si), and polycrystalline silicon (p-Si), suitable for frequency trimming, but is not limited thereto.

The first electrode 1121 and the second electrode 1125 may extend outwardly of the resonator 1120. In addition, the first metal layer 1180 and a second metal layer 1190 may be disposed on the upper surface of the extended portion E, respectively.

The first metal layer 1180 and the second metal layer 1190 may be made of any one material among gold (Au), a gold-tin (Au—Sn) alloy, copper (Cu), a copper-tin (Cu—Sn) alloy, and aluminum (Al), or an aluminum alloy. Here, the aluminum alloy may be an aluminum-germanium (Al—Ge) alloy or an aluminum-scandium (Al—Sc) alloy.

The first metal layer 1180 and the second metal layer 1190 may function as a connection wiring electrically connecting the electrodes 1121 and 1125 of the bulk acoustic resonator on the support substrate 1110 and electrodes of other bulk acoustic resonators disposed adjacent to each other.

At least a portion of the first metal layer 1180 may contact the protective layer 1160 and may be bonded to the first electrode 1121.

In addition, in the resonator 1120, the first electrode 1121 is formed to have a larger area than the second electrode 1125, and the first metal layer 1180 is formed on a peripheral portion of the first electrode 1121.

Therefore, the first metal layer 1180 is disposed along the periphery of the resonator 1120, and is thus disposed in a form surrounding the second electrode 1125. However, the configuration is not limited thereto.

In the bulk acoustic resonator, the hydrophobic layer 1130 may be disposed on a surface of the protective layer 1160 and an inner wall of the cavity C.

When a bulk acoustic resonator is used in a humid environment or is left at room temperature for a long period of time, a hydroxyl group (OH group) is adsorbed to the protective layer 1160 of the bulk acoustic resonator such that a problem in which frequency variations increase due to mass loading or resonance performance deteriorates, may occur.

For example, when the hydrophobic layer 1130 is not formed on a surface of the bulk acoustic resonator, a hydroxyl group (an OH group) may be more easily adsorbed to the protective layer 1160, to form hydroxylate. Since hydroxylate has a high surface energy and is unstable, it attempts to lower the surface energy by adsorbing water, and the like, resulting in mass loading.

On the other hand, when the hydrophobic layer 1130 is formed on the surface of the bulk acoustic resonator, since the surface energy is low and stable, there is no need to lower the surface energy by adsorbing water, hydroxyl group (OH group), and the like. Therefore, the hydrophobic layer 1130 may serve to suppress adsorption of water, hydroxyl group (OH group), and the like, thereby significantly reducing frequency variations, and thus maintaining uniform resonator performance.

The hydrophobic layer 1130 may be formed of a self-assembled monolayer (SAM), not a polymer. When the hydrophobic layer 1130 is formed of a polymer, mass due to the polymer may affect to the resonator 1120. However, in the bulk acoustic resonator, since the hydrophobic layer 1130 is formed of a self-assembled monolayer, it is possible to significantly reduce frequency variations of the bulk acoustic resonator. In addition, the thickness of the hydrophobic layer 1130 according to the position in the cavity C may be uniformly formed.

The hydrophobic layer 1130 may be formed by vapor deposition of a precursor capable of having hydrophobicity. In this case, the hydrophobic layer 1130 may be deposited as a monolayer having a thickness of 100 Å or less (e.g., several Å to tens Å). As the precursor material capable of having hydrophobicity, it may be formed of a material having a contact angle of 90° or more with water after deposition. For example, the hydrophobic layer 1130 may contain a fluorine (F) component, and may include fluorine (F) and silicon (Si). For example, fluorocarbon having a silicon head may be used, but the configuration is not limited thereto.

Meanwhile, in order to improve adhesion between the self-assembled monolayer constituting the hydrophobic layer 1130 and the protective layer 1160, a bonding layer (not shown) may be first formed on a surface of the protective layer 1160 prior to forming the hydrophobic layer 1130.

The bonding layer may be formed by vapor deposition of a precursor having a hydrophobicity functional group on the surface of the protective layer 1160. As the precursor material used for deposition of the bonding layer, hydrocarbon having a silicon head, or siloxane having a silicon head may be used, but the configuration is not limited thereto.

Since the hydrophobic layer 1130 is formed after the first metal layer 1180 and the second metal layer 1190 are formed, the hydrophobic layer 1130 may be formed along the surfaces of the protective layer 1160, the first metal layer 1180, and the second metal layer 1190. In the drawings, an example in which the hydrophobic layer 1130 is not disposed on the surfaces of the first metal layer 1180 and the second metal layer 1190 is illustrated, but the configuration is not limited thereto. The hydrophobic layer 1130 may also be disposed on the surfaces of the first metal layer 1180 and the second metal layer 1190, as needed.

In addition, the hydrophobic layer 1130 may be disposed not only on the upper surface of the protective layer 1160, but also on the inner surface of the cavity C.

The hydrophobic layer 1130 formed in the cavity C may be formed over an entire inner wall forming the cavity C. Accordingly, the hydrophobic layer 1130 may also be formed on a lower surface of the membrane layer 1150 forming a lower surface of a resonator 1120.

In this case, adsorption of hydroxyl groups to a lower portion of the resonator 1120 can be suppressed.

The adsorption of hydroxyl groups may occur in the cavity C as well as in the protective layer 1160. Therefore, in order to minimize the mass loading and the corresponding frequency drop due to the adsorption of hydroxyl groups, it may be preferable to block adsorption of hydroxyl groups not only on the protective layer 1160 but also on an upper surface of the cavity C (the lower surface of the membrane layer), the lower surface of the resonator.

In addition thereto, when the hydrophobic layer 1130 is formed on the upper/lower surface or side surface of the cavity C, it may also provide an effect of suppressing an occurrence of a stiction phenomenon in which the resonator 1120 adheres to an insulating layer 1115 due to surface tension in a wet process or a cleaning process after the cavity C is formed.

Meanwhile, a case in which the hydrophobic layer 1130 is formed over the entire inner wall of the cavity C is illustrated as an example, but the configuration is not limited thereto, and various modifications, such as a hydrophobic layer only being formed on the upper surface of the cavity C, or a hydrophobic layer being formed on at least a portion of the lower surface and the side surface thereof, may be made.

As set forth above, according to various examples of the present disclosure, in the bulk acoustic resonator, a sharper skirt characteristic may be obtained.

However, various and advantageous advantages and effects of the various examples are not limited to the above description, and will be more readily understood in the process of describing specific examples of the present disclosure.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator filter, comprising:
a series bulk acoustic resonator electrically connected, in series, between a first port and a second port through which a radio frequency (RF) signal passes;
a second shunt bulk acoustic resonator, electrically shunt connected between the series bulk acoustic resonator and a ground, and having a resonance frequency lower than a resonance frequency of the series bulk acoustic resonator; and
a first shunt bulk acoustic resonator electrically connected to the second shunt bulk acoustic resonator in series and having a resonance frequency higher than the resonance frequency of the second shunt bulk acoustic resonator,
wherein one or both of the series bulk acoustic resonator and the first shunt bulk acoustic resonator comprises:
a first electrode disposed above a substrate;
a piezoelectric layer disposed on an upper surface of the first electrode;
a second electrode disposed on an upper surface of the piezoelectric layer; and
a trench disposed in an upper surface of the second electrode or above the second electrode and recessed downwardly, and
wherein a frequency of an attenuation pole corresponding to a lowest frequency in a pass band between the first port and the second port is F, a width of the trench is W, and $\{W*F\}$ is $\{0.6*3.485 \ (\mu m*GHz)\}$ or more and $\{1.8*3.485 \ (\mu m*GHz)\}$ or less.

2. The bulk acoustic resonator filter of claim 1, wherein the first shunt bulk acoustic resonator comprises the first electrode, the piezoelectric layer, the second electrode, and the trench.

3. The bulk acoustic resonator filter of claim 2, wherein the resonance frequency of the first shunt bulk acoustic resonator is equal to or higher than the resonance frequency of the series bulk acoustic resonator.

4. The bulk acoustic resonator filter of claim 3, wherein the trench is disposed in the first shunt bulk acoustic resonator and the series bulk acoustic resonator, respectively.

5. The bulk acoustic resonator filter of claim 2, wherein a width of the trench is 0.6 μm or more and 1.8 μm or less.

6. The bulk acoustic resonator filter of claim 5, wherein a depth of the trench exceeds 0 nm and is 100 nm or less.

7. The bulk acoustic resonator filter of claim 5, wherein a bandwidth in a pass band between the first port and the second port is 200 MHz or more.

8. The bulk acoustic resonator filter of claim 2, wherein an area of overlap of the first electrode, the piezoelectric layer, and the second electrode is A, and $\{W/A\}$ is $\{0.6/4900 \ (\mu m/(\mu m)2)\}$ or more and $\{0.6/4900 \ (\mu m/(\mu m)2)\}$ or less.

9. The bulk acoustic resonator filter of claim 1, wherein the trench is disposed adjacent to a periphery of a region in which the first electrode, the piezoelectric layer, and the second electrode overlap each other in a thickness direction.

10. The bulk acoustic resonator filter of claim 1, wherein the trench is recessed toward the piezoelectric layer in the upper surface of the second electrode.

11. The bulk acoustic resonator filter of claim 10, wherein the second electrode comprises a frame protruding upwardly on the upper surface of the second electrode, and
wherein the width of the trench is less than a width of the frame.

12. The bulk acoustic resonator filter of claim 1, wherein the second shunt bulk acoustic resonator is included in a plurality of second shunt bulk acoustic resonators each respectively disposed in a plurality of shunt connection paths between the series bulk acoustic resonator and the ground,
wherein the first shunt bulk acoustic resonator is disposed in a portion of the plurality of shunt connection paths, and
a shunt connection path among the plurality of shunt connection paths, in which the first shunt bulk acoustic resonator is disposed, is disposed between a plurality of shunt connection paths among the plurality of shunt connection paths, in which the first shunt bulk acoustic resonator is not disposed.

13. The bulk acoustic resonator filter of claim 1, wherein the second shunt bulk acoustic resonator is included in a plurality of second shunt bulk acoustic resonators each respectively disposed in a plurality of shunt connection paths between the series bulk acoustic resonator and the ground,
wherein the first shunt bulk acoustic resonator is included in a plurality of first shunt bulk acoustic resonators each electrically connected to a corresponding second shunt bulk acoustic resonator among the plurality of second shunt bulk acoustic resonators in series, and
a number of the plurality of second shunt bulk acoustic resonators is greater than a number of the plurality of first shunt bulk acoustic resonators.

14. The bulk acoustic resonator filter of claim 13, wherein an inductance of at least one shunt connection path among the plurality of shunt connection paths, in which one of the plurality of first shunt bulk acoustic resonators is disposed, is greater than an inductance of each remaining shunt connection path among the plurality of shunt connection paths.

15. The bulk acoustic resonator filter of claim 1, wherein the first shunt bulk acoustic resonator comprises the trench, the second shunt bulk acoustic resonator comprises a trench, and a width of the trench of the second shunt bulk acoustic resonator is different than a width of the trench of the first shunt bulk acoustic resonator.

16. The bulk acoustic resonator filter of claim 1, wherein the second shunt bulk acoustic resonator does not include a trench.

17. A bulk acoustic resonator filter, comprising:
a series bulk acoustic resonator electrically connected, in series, between a first port and a second port through which a radio frequency (RF) signal passes;
a second shunt bulk acoustic resonator, electrically shunt connected between the series bulk acoustic resonator and a ground, and having a resonance frequency lower than a resonance frequency of the series bulk acoustic resonator; and
a first shunt bulk acoustic resonator electrically connected to the second shunt bulk acoustic resonator in series and having a resonance frequency higher than the resonance frequency of the second shunt bulk acoustic resonator,
wherein one or both of the series bulk acoustic resonator and the first shunt bulk acoustic resonator comprises:
a first electrode disposed above a substrate;
a piezoelectric layer disposed on an upper surface of the first electrode;
a second electrode disposed on an upper surface of the piezoelectric layer; and
a trench disposed in an upper surface of the second electrode or above the second electrode and recessed downwardly, and wherein the first shunt bulk acoustic resonator comprises the trench, the second shunt bulk acoustic resonator comprises a further trench, and a width of the further trench of the second shunt bulk acoustic resonator is different than a width of the trench of the first shunt bulk acoustic resonator.

18. A bulk acoustic resonator filter, comprising:

a series bulk acoustic resonator electrically connected, in series, between a first port and a second port through which a radio frequency (RF) signal passes;

a second shunt bulk acoustic resonator, electrically shunt connected between the series bulk acoustic resonator and a ground, and having a resonance frequency lower than a resonance frequency of the series bulk acoustic resonator; and a first shunt bulk acoustic resonator electrically connected to the second shunt bulk acoustic resonator in series and having a resonance frequency higher than the resonance frequency of the second shunt bulk acoustic resonator, wherein one or both of the series bulk acoustic resonator and the first shunt bulk acoustic resonator comprises:

a first electrode disposed above a substrate;

a piezoelectric layer disposed on an upper surface of the first electrode;

a second electrode disposed on an upper surface of the piezoelectric layer; and a trench disposed in an upper surface of the second electrode or above the second electrode and recessed downwardly, wherein the second shunt bulk acoustic resonator is included in a plurality of second shunt bulk acoustic resonators each respectively disposed in a plurality of shunt connection paths between the series bulk acoustic resonator and the ground, wherein the first shunt bulk acoustic resonator is disposed in a portion of the plurality of shunt connection paths, and a shunt connection path among the plurality of shunt connection paths, in which the first shunt bulk acoustic resonator is disposed, is disposed between a plurality of shunt connection paths among the plurality of shunt connection paths, in which the first shunt bulk acoustic resonator is not disposed.

* * * * *